(12) United States Patent
Lin et al.

(10) Patent No.: US 8,050,601 B2
(45) Date of Patent: Nov. 1, 2011

(54) SMART DONOR ROLLS USING INDIVIDUALLY ADDRESSABLE PIEZOELECTRIC ACTUATORS

(75) Inventors: Pinyen Lin, Rochester, NY (US); Baomin Xu, San Jose, CA (US); Lalit K. Mestha, Fairport, NY (US)

(73) Assignees: Xerox Corporation, Norwalk, CT (US); Palo Alto Research Center Incorporated, Palo Alto, CA (US)

( * ) Notice: Subject to any disclaimer, the term of this patent is extended or adjusted under 35 U.S.C. 154(b) by 615 days.

(21) Appl. No.: 12/019,051

(22) Filed: Jan. 24, 2008

(65) Prior Publication Data
US 2009/0190964 A1 Jul. 30, 2009

(51) Int. Cl.
*G03G 15/08* (2006.01)

(52) U.S. Cl. .......... 399/266; 399/252; 399/279; 492/18; 492/53; 29/895

(58) Field of Classification Search .................. 399/252, 399/265, 266, 279, 285; 29/895, 895.3; 492/16–18, 492/48, 53, 56
See application file for complete search history.

(56) References Cited

U.S. PATENT DOCUMENTS

| 5,523,827 | A | * | 6/1996 | Snelling et al. | 399/285 |
| 5,809,385 | A | * | 9/1998 | Snelling et al. | 399/266 |
| 5,965,220 | A | * | 10/1999 | Schopping | 427/598 |
| 6,361,483 | B1 | * | 3/2002 | Kirchner | 492/16 |
| 6,385,429 | B1 | * | 5/2002 | Weber et al. | 399/319 |

* cited by examiner

*Primary Examiner* — David Porta
*Assistant Examiner* — Jessica L Eley
(74) *Attorney, Agent, or Firm* — MH2 Technology Law Group LLP

(57) ABSTRACT

Exemplary embodiments provide a roll member that includes one or more piezoelectric tape and methods for making and using the roll member. The piezoelectric tape can be flexible and include a plurality of piezoelectric elements configured in a manner that the piezoelectric elements can be addressed individually or as groups with various numbers of elements in each group. In an exemplary embodiment, the disclosed roll member can be used as a donor roll for a development system of an electrophotographic printing machine to create controlled and desired toner powder cloud for high quality image development, such as an image on image development in a hybrid scavengeless development (HSD) system.

23 Claims, 8 Drawing Sheets

SMART DONOR ROLLS USING INDIVIDUALLY ADDRESSABLE PIEZOELECTRIC ACTUATORS

FIELD OF THE INVENTION

This invention relates generally to an electrophotographic printing machine and, more particularly, to a roll member including a piezoelectric tape.

BACKGROUND OF THE INVENTION

Electrostatic reproduction involves an electrostatically-formed latent image on a photoconductive member, or photoreceptor. The latent image is developed by bringing charged developer materials into contact with the photoconductive member. The developer materials can include two-component developer materials including carrier particles and charged toner particles for such as "hybrid scavengeless development" having an image-on-image development. The developer materials can also include single-component developer materials including only toner particles. The toner particles adhere directly to a donor roll by electrostatic charges from a magnet or developer roll and are transferred to the photoconductive member from a toner cloud generated in the gap between the photoreceptor and the donor roll during the development process.

A conventional donor roll uses wire electrodes to generate toner clouds. Generally, AC biased wires have been used to provide electrostatic forces to release the toner particles from the donor roll. However, there are several problems with wires. First, toner particles tend to adhere to the wire after prolonged usage even with a non-stick coating on the wires. The adhered toner particles may cause image defects. Secondly, it is not easy to keep the wire clean once the wire is contaminated with toner components. Thirdly, it is difficult to build long wires on the roll for large format printing.

Piezoelectric materials, especially piezoelectric ceramics such as PZT (lead zirconate titanate), can effectively transfer electrical energy to mechanical energy or vice versa, and can be used in electrophotographic printing machines. However, it is difficult to make or mount a large area ceramic piece on a curved surface or embed it in a structure which needs to be flexible. Also it is difficult to put many piezoelectric elements with different shapes together to make a large area array with each element addressable.

Thus, there is a need to overcome these and other problems of the prior art and to provide a roll member using 2-dimensional addressable piezoelectric actuators in a large area and with different shapes.

SUMMARY OF THE INVENTION

According to various embodiments, the present teachings include a roll member. The roll member can include a roll substrate having a piezoelectric tape mounted on the surface of the roll substrate. The piezoelectric tape can further include a plurality of controllable piezoelectric elements to provide localized surface vibrations.

According to various embodiments, the present teachings also include a system for developing an image using the disclosed donor roll. This system can include an imaging receiving member and a donor roll that includes a plurality of controllable piezoelectric elements. The donor roll can be closely spaced from the imaging receiving member for advancing toner particle developer materials to an image on the imaging receiving member. The plurality of controllable piezoelectric elements of the donor roll can be used to detach toner particles from the donor roll and form a toner cloud in the space between the donor roll and the image receiving member with detached toner particles from the toner cloud to develop the image.

According to various embodiments, the present teachings also include a method of forming a roll member. In this method, a piezoelectric tape that includes a plurality of controllable piezoelectric elements can be prepared by sandwiching the plurality of controllable piezoelectric elements between a first tape substrate and a second tape substrate. Each controllable piezoelectric element can be electrically bonded with both the first tape substrate and the second tape substrate. One of the first tape substrate and the second tape substrate of the piezoelectric tape can then be mounted on a surface of a roll substrate.

According to various embodiments, the present teachings further include a method for developing an image using a donor roll. In this method, toner particle developer materials can be advanced to a donor roll. The donor roll can include a plurality of controllable piezoelectric elements. Each piezoelectric element can then be controllably addressed to detach toner particles from the donor roll to form a toner cloud in a space between the donor roll and an image receiving member. An image can then be developed with detached toner particles from the toner cloud on the image receiving member.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention.

DESCRIPTION OF THE EMBODIMENTS

Figure 1A:
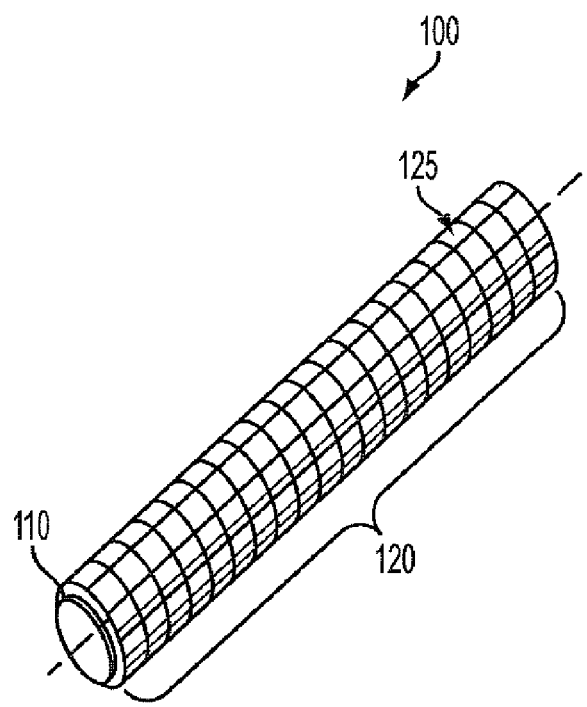
FIGS. 1A-1B depict an exemplary roll member including a piezoelectric tape mounted upon a roll substrate in accordance with the present teachings.

Reference will now be made in detail to the present embodiments (exemplary embodiments) of the invention, an example of which is illustrated in the accompanying drawings. Wherever possible, the same reference numbers will be used throughout the drawings to refer to the same or like parts. In the following description, reference is made to the accompanying drawings that form a part thereof, and in which is shown by way of illustration specific exemplary embodiments in which the invention may be practiced. These embodiments are described in sufficient detail to enable those skilled in the art to practice the invention and it is to be understood that other embodiments may be utilized and that changes may be made without departing from the scope of the invention. The following description is, therefore, merely exemplary.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function. Furthermore, to the extent that the terms "including", "includes", "having", "has", "with", or variants thereof are used in either the detailed description and the claims, such terms are intended to be inclusive in a manner similar to the term "comprising." As used herein, the term "one or more of" with respect to a listing of items such as, for example, A and B, means A alone, B alone, or A and B. The term "at least one of" is used to mean one or more of the listed items can be selected.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Exemplary embodiments provide a roll member that includes one or more piezoelectric tapes and methods for making and using the roll member. The piezoelectric tape can be flexible and include a plurality of piezoelectric elements configured in a manner that the piezoelectric elements can be addressed individually and/or be divided into and addressed as groups with various numbers of elements in each group. For this reason, the plurality of piezoelectric elements can also be referred to herein as the plurality of controllable piezoelectric elements. In an exemplary embodiment, the disclosed roll member can be used as a donor roll for a development system of an electrophotographic printing machine to create toner powder cloud for high quality image development, such as image on image in hybrid scavengeless development (HSD) system. For example, when a feed forward image content information is available, the toner cloud can be created only where development is needed.

As used herein, the term "roll member" or "smart roll" refers to any member that requires a surface actuation and/or vibration in a process, e.g., to reduce the surface adhesion of toner particles, and thus actuate the toner particles to transfer to a subsequent member. Note that although the term "roll member" is referred to throughout the description herein for illustrative purposes, it is intended that the term also encompass other members that need an actuation/vibration function on its surface including, but not limited to, a belt member, a film member, and the like. Specifically, the "roll member" can include one or more piezoelectric tapes mounted over a substrate. The substrate can be a conductive or non-conductive substrate depending on the specific design and/or engine architecture.

The "piezoelectric tape" can be a strip (e.g., long and narrow) that is flexible at least in one direction and can be easily mounted on a curved substrate surface, such as a cylinder roll. As used herein, the term "flexible" refers to the ability of a material, structure, device or device component to be deformed into a curved shape without undergoing a transformation that introduces significant strain, such as strain characterizing the failure point of a material, structure, device, or device component. The "piezoelectric tape" can include, e.g., a plurality of piezoelectric elements disposed (e.g. sandwiched) between two tape substrates. The tape substrate can be conductive and flexible at least in one direction. The tape substrate can include, for example, a conductive material, or an insulative material with a surface conductive layer. For example, the two tape substrates can include, two metallized polymer tapes, one metallized polymer tape and one metal foil, or other pairs. The metallized polymer tape can further include surface metallization layer formed on an insulative polymer material including, for example, polyester such as polyethylene terephthalate (PET) with a trade name of Mylar and Melinex, and polyimide such as with a trade name of Kapton developed by DuPont. The metallization layer can be patterned, in a manner such that the sandwiched piezoelectric elements can be addressed individually or as groups with various numbers of elements in each group. In addition, the piezoelectric tape can provide a low cost fabrication as it can be batch manufactured.

Figure 1B:
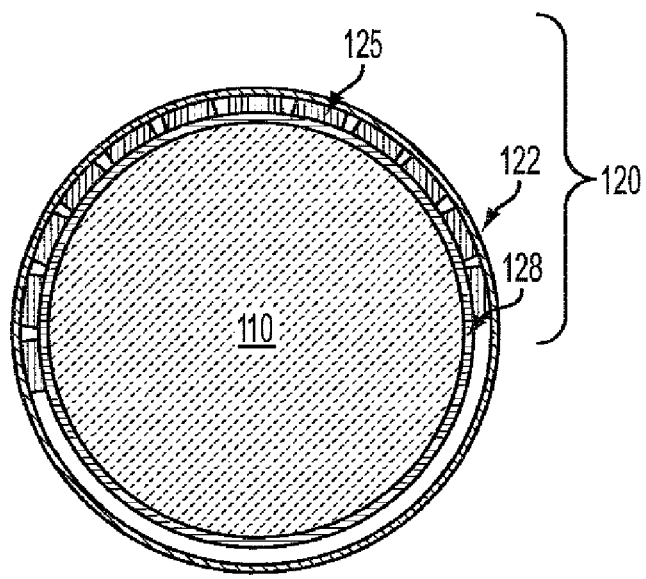

FIGS. 1A-1B depict an exemplary roll member 100 including a piezoelectric tape mounted upon a roll substrate in accordance with the present teachings. In particular, FIG. 1A is a perspective view in partial section of the exemplary roll member 100, while FIG. 1B is a cross-sectional view of the exemplary roll member 100 shown in FIG. 1A. It should be readily apparent to one of ordinary skill in the art that the roll member depicted in FIGS. 1A-1B represents a generalized schematic illustration and that other elements/tapes can be added or existing elements/tapes can be removed or modified.

As shown in FIG. 1A, the exemplary roll member 100 can include a roll substrate 110, and a piezoelectric tape 120. The piezoelectric tape 120 can be mounted upon the roll substrate 110.

The substrate 110 can be formed in various shapes, e.g., a cylinder, a core, a belt, or a film, and using any suitable material that is non-conductive or conductive depending on a specific configuration. For example, the substrate 110 can take the form of a cylindrical tube or a solid cylindrical shaft of, for example, plastic materials or metal materials (e.g., aluminum, or stainless steel) to maintain rigidity, structural integrity. In an exemplary embodiment, the substrate 110 can be a solid cylindrical shaft. In various embodiments, the substrate 110 can have a diameter of the cylindrical tube of about 30 mm to about 300 mm, and have a length of about 100 mm to 1000 mm.

The piezoelectric tape 120 can be formed over, e.g., wrapped around, the substrate 110 as shown in FIG. 1. The piezoelectric tape 120 can include a layered structure (see FIG. 1B) including a plurality of piezoelectric elements 125 disposed between a first tape substrate 122 and a second tape substrate 128. In various embodiments, the piezoelectric tape 120 can be wrapped around the roll substrate 110 in a manner that the plurality of piezoelectric elements 125 can cover wholly or partially (see FIG. 1B) on the peripheral circumferential surface of the substrate 110.

Figure 2:
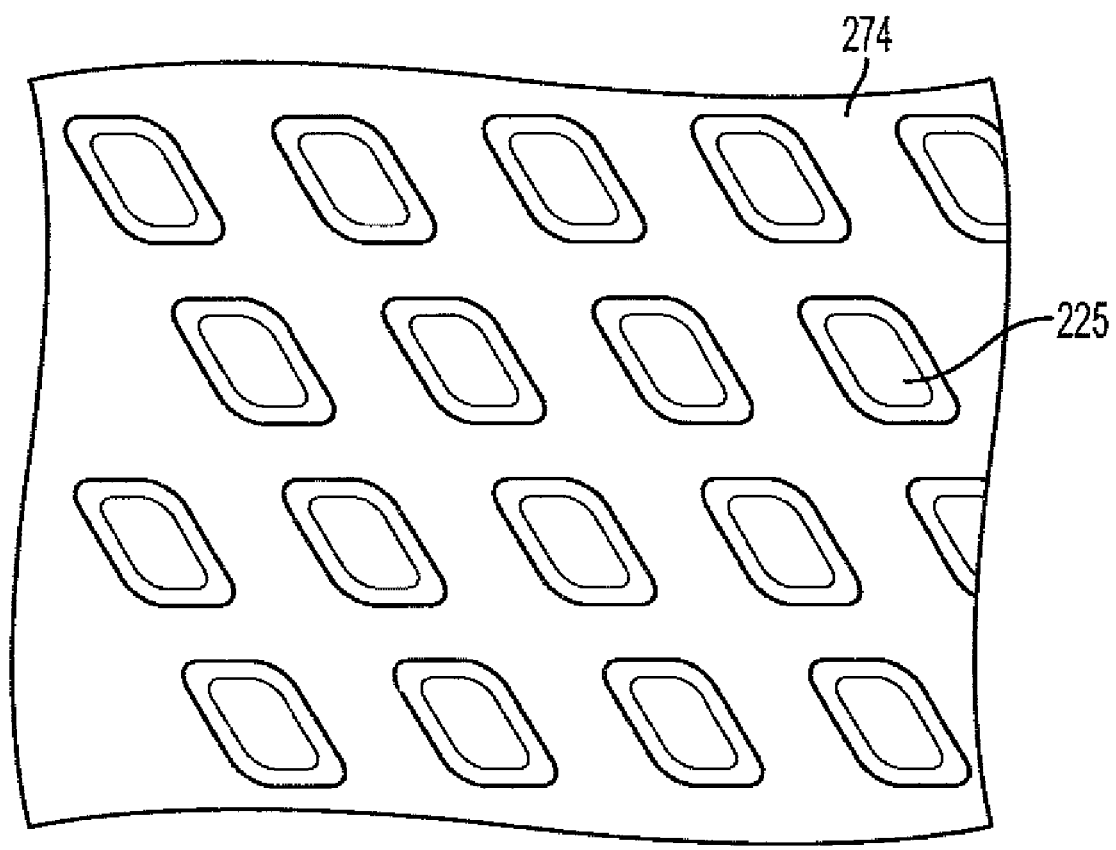
FIG. 2 depicts a top view of exemplary piezoelectric elements in a non-curved condition in accordance with the present teachings.

The plurality of piezoelectric elements 125 can be arranged, e.g., as arrays. For example, FIG. 2 depicts a top view of the exemplary piezoelectric element arrays 225 formed on a substrate 274 (e.g., sapphire) in accordance with the present teachings. As shown, the piezoelectric element arrays 225 can be formed in a large area containing a desired element number. It should be noted that although the piezoelectric elements shown in FIG. 2 are in parallelogram shape, any other suitable shapes, such as, for example, circular, rectangular, square, or long strip shapes, can also be used for the piezoelectric elements.

In various embodiments, the array 225 of the piezoelectric elements can have certain geometries or distributions according to specific applications. In addition, each piezoelectric element as disclosed (e.g., 125/225 in FIGS. 1-2) can be formed in a variety of different geometric shapes for use in a single piezoelectric tape 120. Further, the piezoelectric elements 125/225 can have various thicknesses ranging from about 10 μm to millimeter (e.g., 1 mm) in scale. For example, the piezoelectric element 125/225 can have a uniform thickness of about 100 μm in a single piezoelectric tape 120. In various embodiments, some of the plurality of piezoelectric elements 125 can have one thickness (e.g., about 100 μm), and others can have another one or more different thicknesses (e.g., about 50 μm). Furthermore, the piezoelectric elements 125/225 can include different piezoelectric materials, including ceramic piezoelectric elements such as soft PZT (lead zirconate titanate) and hard PZT, or other functional ceramic materials, such as antiferroelectric materials, electrostrictive materials, and magnetostrictive materials, used in the same single piezoelectric tape 120. The composition of the piezoelectric ceramic elements can also vary, including doped or undoped, e.g., lead zirconate titanate (PZT), lead titanate, lead zirconate, lead magnesium titanate and its solid solutions with lead titanate, lithium niobate, and lithium tantanate.

Referring back to FIGS. 1A-1B, each piezoelectric element 125 (or 225 in FIG. 2) mounted on the substrate 110 can be addressed individually and/or in groups with drive electronics mounted, e.g., on the side of a roll substrate 110, underneath the roll substrate 110, or distributed inside the piezoelectric tape 120. When the piezoelectric elements 125 are addressed in groups, the selection of each group, e.g., the selection of the number, shape, distribution of the piezoelectric elements 125 in each group, can be determined by the desired spatial actuation of a particular application. In various embodiments, an insulative material can be optionally inserted between the tape substrates 122 and 128 and around the plurality of piezoelectric elements 125 for electrical isolation. In an exemplary embodiment, due to the controllable addressing of each piezoelectric element 125, the roll member 100 can be used as a donor roll to release toner particles and generate a localized toner cloud for high quality image development such as for image on image printers.

Figure 3:
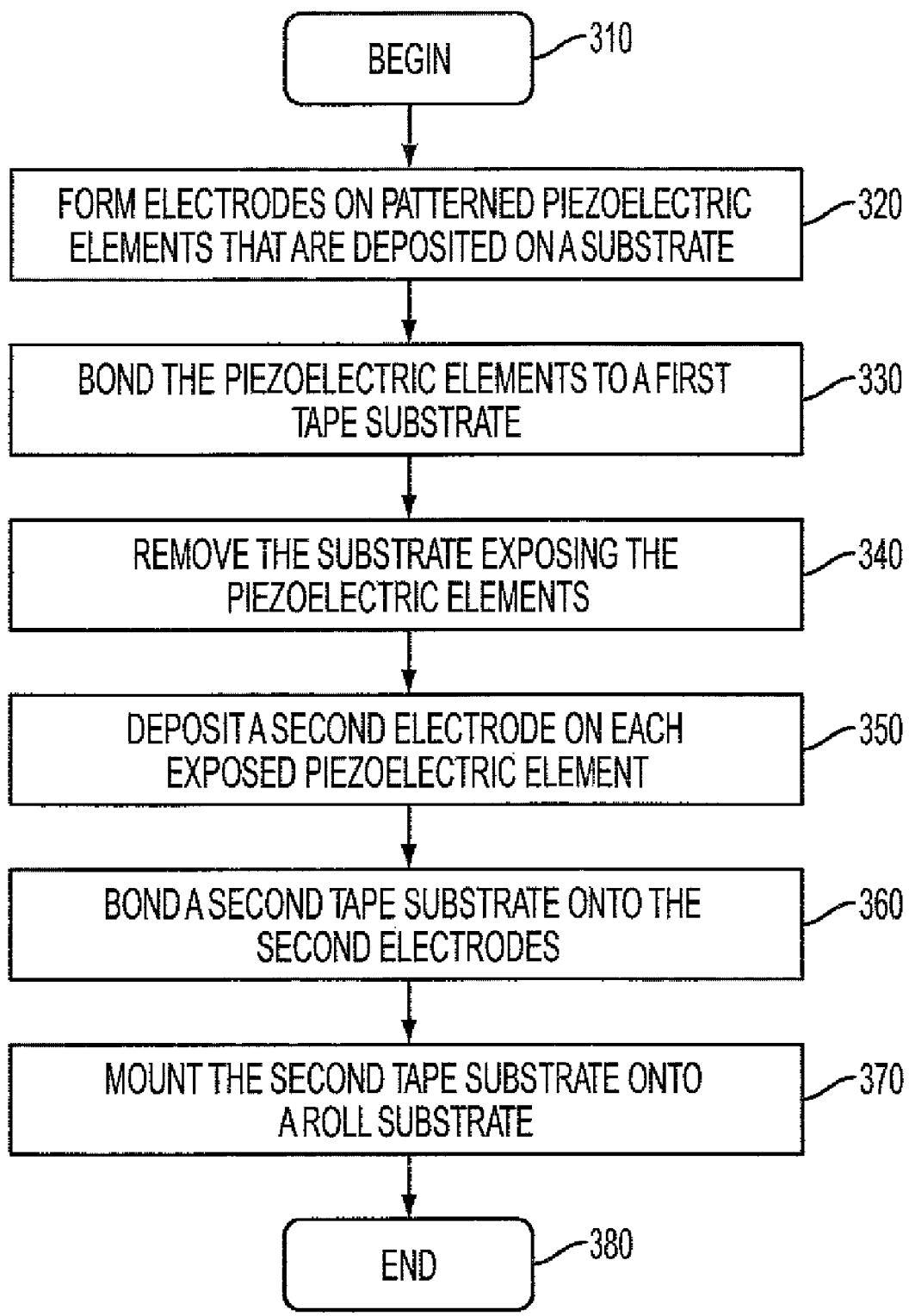
FIG. 3 illustrates an exemplary process flow for manufacturing the roll member of FIGS. 1-2 in accordance with the present teachings.

FIG. 3 illustrates an exemplary process flow 300 for manufacturing the roll member 100 of FIGS. 1-2 in accordance with the present teachings. While the exemplary process 300 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the present teachings. In addition, not all illustrated steps may be required to implement a methodology in accordance with the present teachings. Also, the following manufacturing techniques are intended to be applicable to the generation of individual elements and arrays of elements.

The process 300 begins at 310. At 320, patterned piezoelectric elements can be formed on a substrate, followed by forming an electrode over each patterned piezoelectric element.

For example, the piezoelectric elements can be ceramic piezoelectric elements that is first fabricated by depositing the piezoelectric material (e.g., ceramic type powders) onto an appropriate substrate by use of, for example, a direct marking technology as known to one of ordinary skill in the art. The fabrication process can include sintering the material at a certain temperature, e.g., about 1100° C. to about 1350° C. Other temperature ranges can also be used in appropriate circumstance such as for densifications. Following the fabrication process, the surface of the formed structures of piezoelectric elements can be polished using, for example, a dry tape polishing technique. Once the piezoelectric elements have been polished and cleaned, electrodes can be deposited on the surface of the piezoelectric elements.

At 330, the piezoelectric elements can be bonded to a first tape substrate through the electrodes that are overlaid the piezoelectric elements. The first tape substrate can be flexible and conductive or has a surface conductive layer. For example, the first tape substrate can include a metal foil or a metallized polymer tape. In various embodiments, the tape substrate can be placed on a rigid carrier plate for an easy carrying during the fabrication process.

At 340, the substrate on which the piezoelectric elements are deposited can be removed through, for example, a liftoff process, using an exemplary radiation energy such as from a laser or other appropriate energy source. The releasing process can involve exposure of the piezoelectric elements to a radiation source through the substrate to break an attachment interface between the substrate and the piezoelectric elements. Additional heating can also be implemented, if necessary, to complete removal of the substrate.

At 350, once the liftoff process has been completed, a second electrode can be deposited on each exposed piezoelectric element. In various embodiments, the electric property, for example, a dielectric property, of each piezoelectric element can be measured to identify if the elements meet required criteria by, e.g., poling of the elements under high voltage.

At 360, a second tape substrate can be bonded to the second electrodes formed on the piezoelectric elements. In various embodiments, prior to bonding the second tape substrate, an insulative filler can be optionally inserted around the piezoelectric elements for electrical isolation. Again the second tape substrate can include, for example, a metal foil or metallized polymer tape.

At 370, the assembled arrangement including the piezoelectric elements sandwiched between the first and the second tape substrates can then be removed from the carrier plate. Such assembled arrangement can be used as a piezoelectric tape and further be mounted onto a roll substrate to form various roll members as indicated in FIGS. 1A-1B. The process 300 can conclude at 380.

Figure 4A:
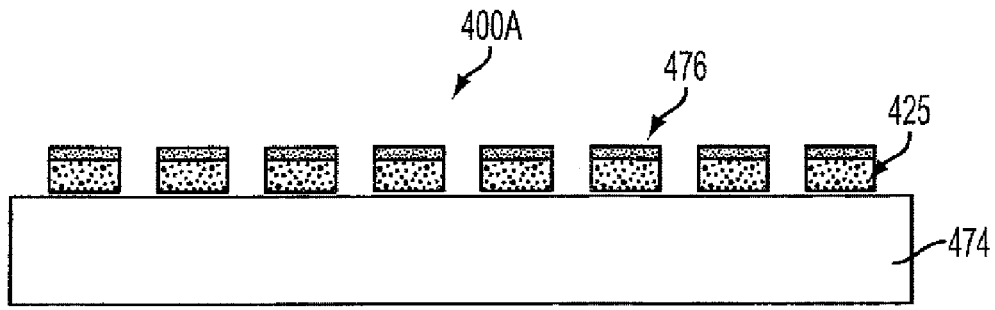
FIGS. 4A-4H depict an exemplary roll member at various stages during the fabrication according to the process flow of FIG. 3 in accordance with the present teachings.

FIGS. 4A-4H depict an exemplary roll member 400 at various stages of the fabrication generally according to the process flow 300 of FIG. 3 in accordance with the present teachings. In FIG. 4A, the device 400A can include a plurality of piezoelectric elements 425, a substrate 474, and a plurality of electrodes 476. The plurality of piezoelectric elements 425 can be formed on the substrate 474 and each piezoelectric element 425 can further have an electrode 476 formed thereon.

The piezoelectric elements 425, e.g., piezoelectric ceramic elements, can be deposited on the substrate 474, and then, for example, sintered at about 1100° C. to about 1350° C. for densification. The depositing step can be achieved by a number of direct marking processes including screen printing, jet printing, ballistic aerosol marking (BAM), acoustic ejection, or any other suitable processes. These techniques can allow flexibility as to the type of piezoelectric element configurations and thicknesses. For example, when the piezoelectric elements 425 are made by screen printing, the screen printing mask (mesh) can be designed to have various shapes or openings resulting in a variety of shapes for the piezoelectric elements 425, such as rectangular, square, circular, ring, among others. Using single or multiple printing processes, the thickness of the piezoelectric elements 425 can be from about 10 μm to millimeter scale. In addition, use of these direct marking techniques can allow generation of very fine patterns and high density elements.

The substrate 474 used in the processes of this application can have certain characteristics, e.g., due to the high temperatures involved. In addition, the substrate 474 can be at least partially transparent for a subsequent exemplary liftoff process, which can be performed using an optical energy. Specifically, the substrate can be transparent at the wavelengths of a radiation beam emitted from the radiation source, and can be inert at the sintering temperatures so as not to contaminate the piezoelectric materials. In an exemplary embodiment, the substrate 474 can be sapphire. Other potential substrate materials can include, but not limited to, transparent alumina ceramics, aluminum nitride, magnesium oxide, strontium titanate, among others. In various embodiments, the selected substrate material can be reusable, which provides an economic benefit to the process.

In various embodiments, after fabrication of the piezoelectric elements 425 and prior to the subsequent formation of the electrodes 476, a polishing process followed by a cleaning process of the top surface of the piezoelectric elements 425 can be conducted to ensure the quality of the piezoelectric elements 425 and homogenizes the thickness of piezoelectric elements 425 of, such as a chosen group. In an exemplary embodiment, a tape polishing process, such as a dry tape polishing process, can be employed to remove any possible surface damages, such as due to lead deficiency, to avoid, e.g., a crowning effect on the individual elements. Alternatively, a wet polishing process can be used.

After polishing and/or cleaning of the piezoelectric elements 425, the metal electrodes 476, such as Cr/Ni or other appropriate materials, can be deposited on the surface of the piezoelectric elements 425 by techniques such as sputtering or evaporation with a shadow mask. The electrodes 476 can also be deposited by one of the direct marking methods, such as screen printing.

Figure 4B:
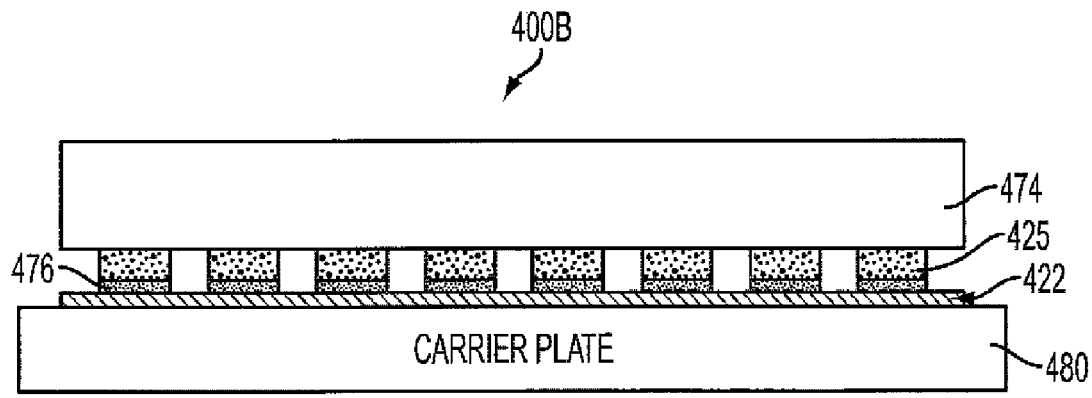

In FIG. 4B, the piezoelectric elements 425 along with the electrodes 476 can be bonded to a first tape substrate 422. The first tape substrate 422 can have a flexible and conductive material, such as a metal foil (thus it can also be used as common electrode) or a metallized tape, which can work as a common connection to all the piezoelectric elements 425. The metallized tape can include, for example, a metallization layer on a polymer. In various embodiments, the first tape substrate 422 can be carried on a carrier plate 480 using, e.g., a removable adhesive.

When bonding the exemplary metal foil 422 to the piezoelectric elements 425 through the electrodes 476, a conductive adhesive, e.g., a conductive epoxy, can be used. In another example, the bonding of the exemplary metal foil 422 with the electrodes 476 can be accomplished using a thin (e.g., less than 1 μm) and nonconductive epoxy layer (not shown), that contains sub-micron conductive particles (such as Au balls) to provide the electric contact between the surface electrode 476 of the piezoelectric elements 425 and the metal foil 422. That is, the epoxy can be conductive in the Z direction (the direction perpendicular to the surface of metal foil 422), but not conductive in the lateral directions.

In a further example, bonding to the first tape substrate 422 can be accomplished by using a thin film intermetallic transient liquid phase metal bonding after the metal electrode deposition, such as Cr/Ni deposition, to form a bond. In this case, certain low/high melting-point metal thin film layers can be used as the electrodes for the piezoelectric elements 425, thus in some cases it is not necessary to deposit the extra electrode layer 476, such as Cr/Ni. For example, the thin film intermetallic transient liquid phase bonding process can include a thin film layer of high melting-point metal (such as silver (Ag), gold (Au), Copper (Cu), or Palladium (Pd)) and a thin film layer of low melting-point metal (such as Indium (In), or Tin (Sn)) deposited on the piezoelectric elements 425 (or the first tape substrate 422) and a thin layer of high melting-point metal (such as Ag, Au, Cu, Pd) can be deposited on the first tape substrate 422 (or the piezoelectric elements 425) to form a bond. Alternatively, a multilayer structure with alternating low melting-point metal/high melting-point metal thin film layers (not shown) can be used.

Figure 4C:
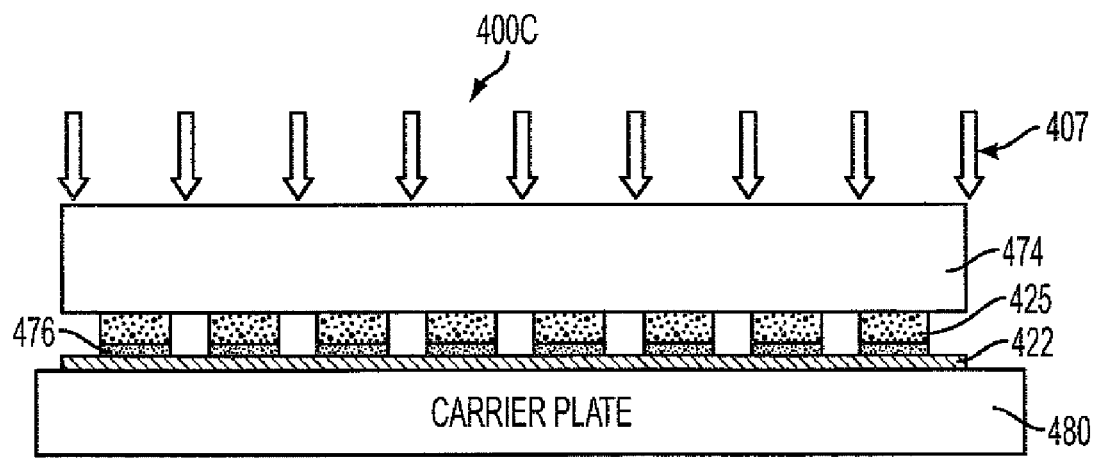

In FIG. 4C, the piezoelectric elements 425 can be released from substrate 474, e.g., using radiation of a beam through the substrate 474 during a liftoff process. The substrate 474 can first exposed to a radiation beam (e.g., a laser beam) from a radiation source (e.g., an excimer laser) 407, having a wavelength at which the substrate 474 can be at least partially transparent. In this manner a high percentage of the radiation beams can pass through the substrate 474 to the interface between the substrate 474 and elements 425. The energy at the interface can be used to break down the physical attachment between these components, i.e., the substrate 474 and the elements 425. In various embodiments, heat can be applied following the operation of the radiation exposure. For example, a temperature of about 40° C. to about 50° C. can be sufficient to provide easy detachment of any remaining contacts to fully release the piezoelectric elements 425 from the substrate 474.

Figure 4D:
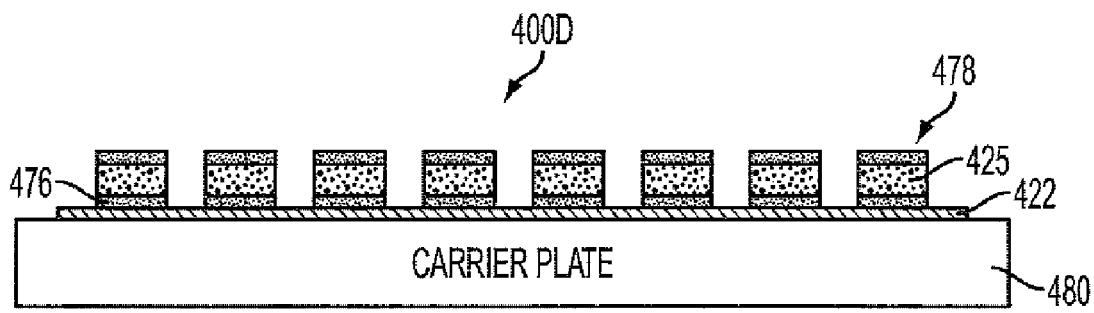

In FIG. 4D, a plurality of second electrodes 478, such as Cr/Ni, can be deposited on the released surfaces of the piezoelectric elements 425 with a shadow mask or by other appropriate methods. In various embodiments, after second electrode deposition, the piezoelectric elements 425 can be poled to measure piezoelectric properties as known in the art.

Figure 4E:
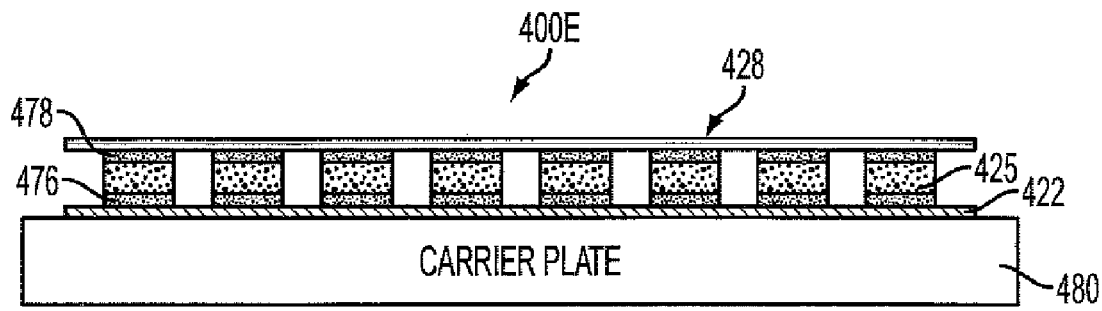
Figure 4F:
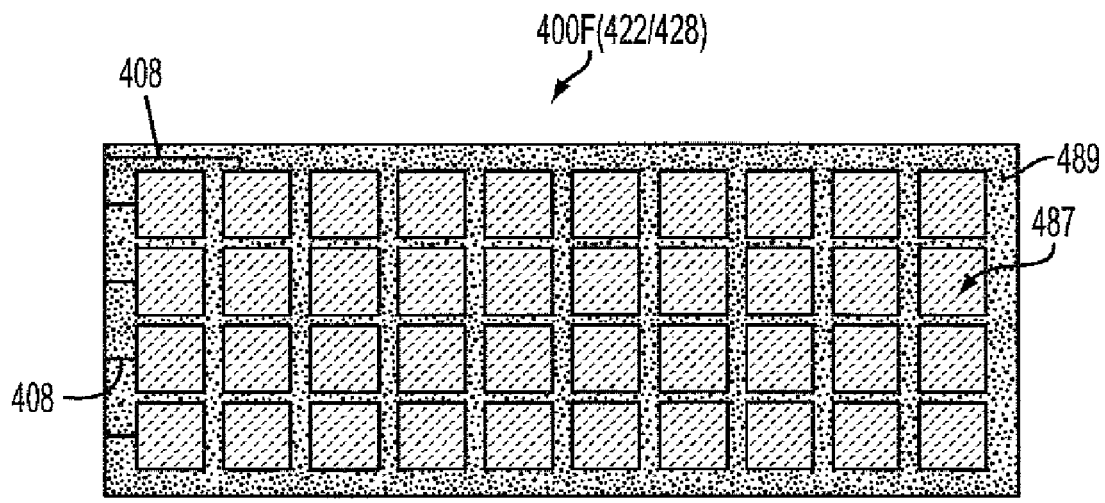

In FIG. 4E, the device 400 can include a second tape substrate 428, such as a metallized polymer tape as disclosed herein, bonded to the plurality of electrodes 478. FIG. 4F depicts an exemplary metallized polymer tape used for the first and the second tape substrates 422 (or 122 of FIG. 1B) and 428 (or 128 of FIG. 1B) of the device 400 (or the roll member 100 in FIGS. 1A-1B) in accordance with the present teachings. As shown, the metallized polymer tape can include a plurality of patterned surface metallizations 487 formed on an insulative material 489 such as a polymer. The plurality of patterned surface metallizations 487 can have various configurations for certain applications. For example, the surface metallizations 487 can be patterned on the exemplary polymer 489 in such a manner that the bonded piezoelectric elements 425 can be addressed individually or as groups with different numbers of elements in each group. In various embodiments, the metallization layer 487 on the polymer tape 489 can have no pattern for all the bonded piezoelectric elements 425 connected together. In various embodiments, the device 400 F, e.g., the first or the second tape substrate 422 or 428 of the device 400, can have an embedded conductive line 408 connecting each surface metallization 487 to a power supply (not shown) and exposed on the surface of the polymer tape 489, and to further contact each PZT element 487. For example, as shown in FIG. 4F, each exemplary connecting line 408 can be configured from the edge to each surface metallization 487 and thus to connect each PZT 425, e.g., when using the device configuration shown in FIG. 4E.

When bonding the second tape substrate 428 (see FIG. 4F) to the piezoelectric elements 425, each surface metallization 487 of the second tape substrate 428 can be bonded onto one of the electrodes 478 using, for example, thin nonconductive epoxy bonding containing submicron conductive ball, thin film intermetallic transient liquid phase bonding, or conductive adhesive. If appropriate, the second tape substrate 428 bonded to the piezoelectric elements 425 can also be placed on a rigid carrier plate, e.g., as similar to the carrier plate 480 for supporting and easy carrying the tape substrate 428 during the fabrication process. Optionally, filler materials, such as punched mylar or teflon or other insulative material, can be positioned between the piezoelectric elements 425 to electrically isolate the first tape substrate 422 and the second tape substrate 428 or the surface conductive layers of these substrates from each other.

Figure 4G:
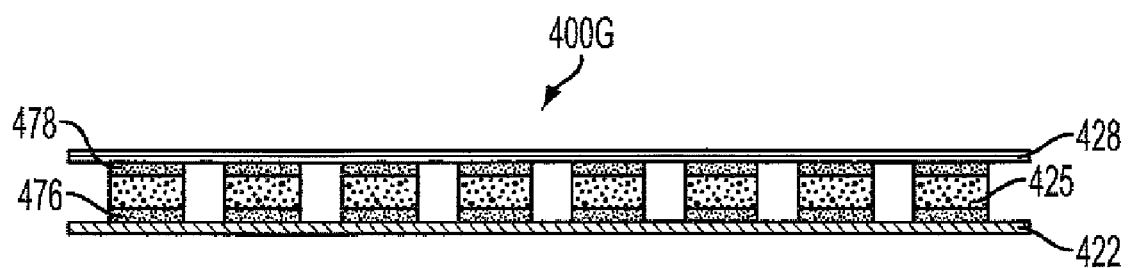

In FIG. 4G, an exemplary piezoelectric tape 400G (also see 120 in FIGS. 1-2) can be obtained by removing the rigid carrier plate 480 from the device 400F. As shown, the piezoelectric tape 400G can include a plurality of elements 425, such as piezoelectric ceramic elements, sandwiched between the first tape substrate 422 and the second tape substrate 428. The substrates 422 and 428 can be flexible and conductive or have a surface conductive layer.

Figure 4H:
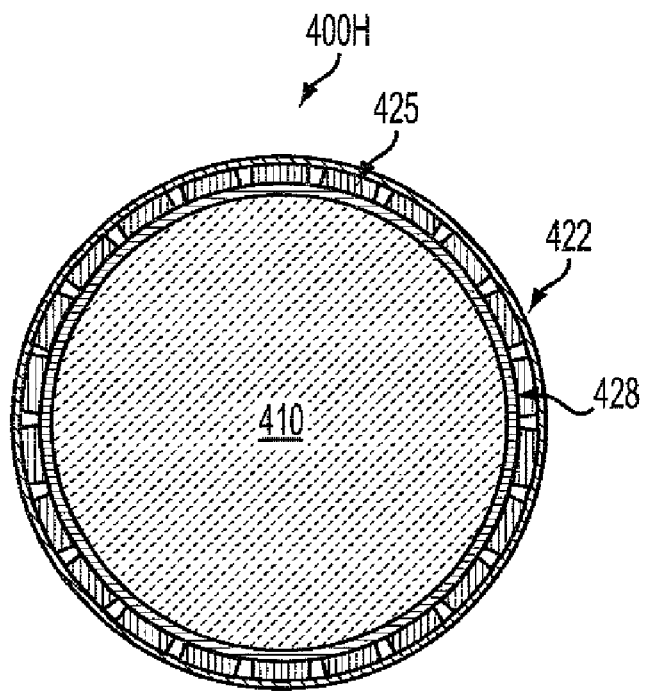

FIG. 4H depicts a cross section of an exemplary roll member 400H (also see the roll member 100 in FIG. 1B) including the formed piezoelectric tape 400G mounted upon an exemplary roll substrate 410. Specifically, for example, the second tape substrate 428 of the piezoelectric tape 400G can be wrapped around the peripheral circumferential surface of the roll substrate 410 to form the roll member 400H. In various embodiments, the piezoelectric tape 400G can be mounted on the roll substrate 410 (also see 110 of FIG. 1A) having large lateral dimensions.

In various embodiments, the exemplary roll member 400H can be formed using various other methods and processes. For example, in an alternative embodiment, one of the tape substrates, such as the first tape substrate 422 can be omitted from the device 400B, 400C, 400D, 400E, 400F and 400G in FIGS. 4B-4G resulting a piezoelectric tape 400G' (not shown) with one tape substrate, that is, having piezoelectric elements 425 formed on the one tape substrate 428. The piezoelectric tape 400G' (not shown) can then be mounted on the roll substrate 410 with the plurality of piezoelectric elements 425 exposed on the surface. Another tape substrate 422' can then be bonded onto the exposed piezoelectric elements 425 to form a roll member 400H'. In this case, the tape substrate 422' can have, for example, a sleeve-like shape, to be mounted onto the roll member to avoid an open gap on the surface.

Depending on the desired spatial resolution for a particular application, e.g., to release the toner particles, the dimension of the piezoelectric elements (see 125/225 in FIGS. 1-2 or 425 in FIG. 4) can also be controlled. For example, screen printed piezoelectric elements can provide lateral dimension as small as 50 μm×50 μm with a thickness ranging from about 30 μm to about 100 μm. In addition, the feature resolution of the disclosed piezoelectric elements (see 125/225 in FIGS. 1-2 or 425 in FIG. 4) can range from about 40 μm to about 500 μm. In an additional example, the feature resolution can be about 600 dpi or higher.

Various techniques, such as laser micromachining, can be used to provide finer feature resolution during the fabrication process as shown in FIG. 3 and/or FIGS. 4A-4H. In one example, a dummy piezoelectric film without patterning can be first screen printed or doctor bladed on a large area sapphire substrate (e.g., the substrate 274 in FIG. 2 and/or the substrate 474 in FIG. 4A). Laser micromachining pattern method can then be applied to obtain finer feature sizes. In another example, finer feature size can be obtained by patterning thin bulk PZT pieces (e.g., having a thickness of about 50 μm to about 1 mm) to form piezoelectric element arrays with fine PZT elements for a better piezoelectric properties (e.g., the piezoelectric displacement constant d33 can be higher than 500 pm/V). In this case, in order to have large lateral dimensions, a desired number of thin bulk PZT material (e.g., pieces) can be arranged together prior to the laser micromachining.

For example, FIGS. 5A-5D depict another exemplary roll member 500 at various stages of the fabrication in accordance with the present teachings. In this example, the fabrication process can be performed with a combination of any suitable cutting or machining techniques.

Figure 5A:
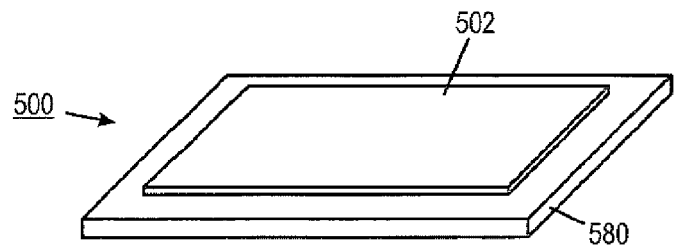
FIGS. 5A-5D depict another exemplary roll member at various stages of the fabrication in accordance with the present teachings.

In FIG. 5A, the device 500 can include a piece of thin bulk piezoelectric material (e.g., ceramic) 502 bonded on a carrier plate 580. The thin bulk piezoelectric material 502 can have a thickness ranging from about 50 μm to about 1 mm. The thin bulk piezoelectric material 502 can be bonded onto the carrier plate 580 using, e.g., a removal adhesive known to one of ordinary skill in the art. In various embodiments, a plurality of thin bulk piezoelectric material 502 can be placed on the carrier plate 580 to provide a desired large area for the subsequent formation of piezoelectric tapes.

Figure 5B:
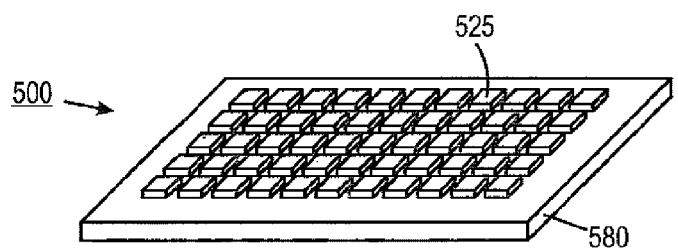

In FIG. 5B, each piece of the thin bulk piezoelectric material 502 (see FIG. 5A) can be cut into a number of small piezoelectric elements 525. This cutting process can be performed using suitable techniques, such as, for example, laser cutting and/or saw cutting. The dimensions of the cut piezoelectric elements 525 can be critical to determine the final resolution of the device 500. For example, in order to obtain a resolution of about 600 dpi, each small piezoelectric element 525 can be cut to have lateral dimensions of about 37 μm×37 μm with a interval gap of about 5 μm, that is, having an exemplary pitch of about 42 μm.

Figure 6:
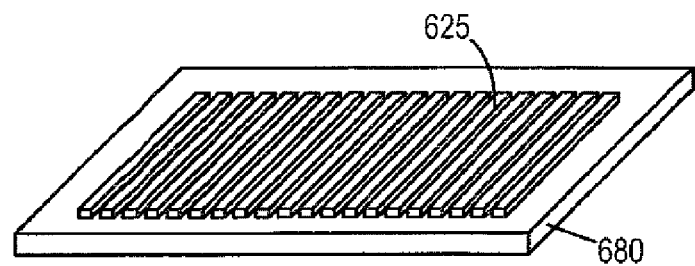
FIG. 6 depicts an alternative cutting structure for the small piezoelectric elements bonded onto a carrier plate in accordance with the present teachings.

In various embodiments, each piece of the thin bulk piezoelectric material 502 (see FIG. 5A) can be cut into a number of small piezoelectric elements 525, that have a variety of different geometric shapes/areas, and distributions in a single piezoelectric tape. FIG. 6 depicts an alternative cutting structure for the small piezoelectric elements 625 bonded onto a carrier plate 680 in accordance with the present teachings. As compared with the device 500 in FIG. 5B, the exemplary cut piezoelectric elements 625 can have a geometric shape of, for example, a long and narrow rectangular strip, which can provide flexibility in the horizontal direction.

Figure 5C:
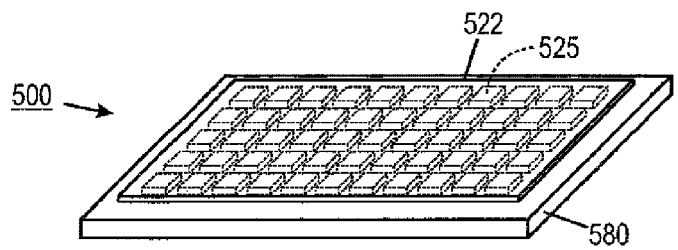

In FIG. 5C, the device 500 can include a first tape substrate 522 bonded onto the cut piezoelectric elements 525. The first tape substrate 522 can be a flexible and conductive material, such as a metal foil (thus it can also be used as common electrode) or a metallized polymer tape. The metallized tape can include, for example, a metallization layer on a polymer. The first tape substrate 522 can be bonded onto the cut piezoelectric elements 525 using the disclosed bonding techniques including, but not limited to, a thin nonconductive epoxy bonding containing submicron conductive ball, a thin film intermetallic transient liquid phase bonding, or a conductive adhesive bonding.

Figure 5D:
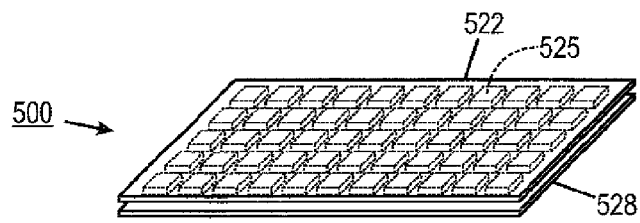

In FIG. 5D, the carrier plate 580 can be replaced by a second tape substrate 528. For example, the carrier plate 580 can be first removed from the device 500 shown in FIG. 5C, and the second tape substrate 528 can then be bonded onto the cut piezoelectric elements 525 from the other side that is opposite to the first tape substrate 522. As a result, the device 500 in FIG. 5D can have a plurality of small piezoelectric elements 525 configured between the two tape substrates 522 and 528 and thereby forming a piezoelectric tape. This piezoelectric tape in FIG. 5D can then be mounted onto a roll substrate (not shown), such as, the roll substrate 110 shown in FIGS. 1A-1B, and/or the roll substrate 410 shown in FIG. 4H to form a disclosed roll member (not shown) as similarly shown and described in FIGS. 1A-1B and FIG. 4H.

The formed roll member as describe above in FIGS. 1-5 can be used as, e.g., a donor roll for a development system in an electrophotographic printing machine. The donor roll can include a plurality of piezoelectric elements to locally actuate and vibrate toner particles with a displacement to release toner particles from the donor roll. In an exemplary theoretical calculations, the vibration displacement (δ) generated under an applied voltage (V) can be described using the following equation:

$$\delta = d_{33} \cdot V \quad (1)$$

Where d33 is a displacement constant. Then the velocity can be:

$$v = 2\pi f \cdot \delta = 2\pi f \cdot d_{33} \cdot V \quad (2)$$

Where f is the frequency, and the acceleration a can be:

$$a = 2\pi f \cdot v = (2\pi f)^2 \cdot d_{33} \cdot V \quad (3)$$

Then the force applied on the toner particle can be:

$$F = ma = m \cdot (2\pi f)^2 \cdot d_{33} \cdot V \quad (4)$$

Where m is the mass of the toner particle. According to the equation (4), if assuming the d33 of the piezoelectric elements is about 350 pm/V, the applied voltage is about 50V, the frequency is about 1 MHz, the toner particle diameter is about 7 µm and the density is about 1.1 g/cm³, the vibration force can be calculated to be about 136 nN. Since the piezoelectric elements can be driven at 50V or lower, there can be no commutation problem while transferring drive power to the circuitry. Generally, adhesion forces of toner particles to the donor roll can be from about 10 nN to about 200 nN. Thus the calculated force (e.g., about 136 nN) from the disclosed donor roll can be large enough to overcome the adhesion forces and hence generate uniform toner cloud. On the other hand, however, the frequency can be easily increased to be about 2 MHz, the generated force according to equation (4) can then be calculated to be about 544 nN, which is four times higher as compared with when the frequency is about 1 MHz and can easily overcome the adhesion force of toner particles to the donor roll.

Figure 7:
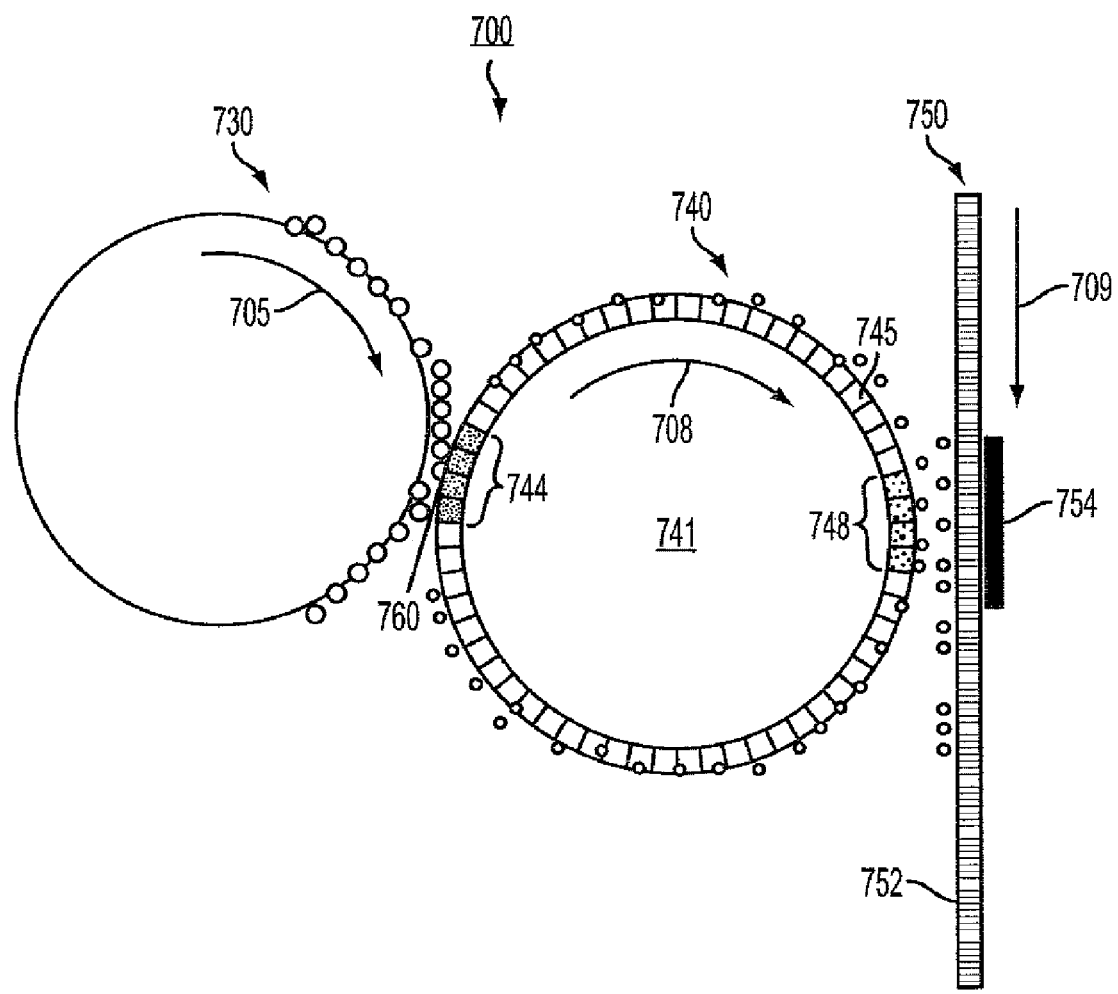
FIG. 7 depicts an exemplary development system using a donor roll member in an electrophotographic printing machine in accordance with the present teachings.

FIG. 7 depicts an exemplary development system 700 using a donor roll member in an electrophotographic printing machine in accordance with the present teachings. It should be readily apparent to one of ordinary skill in the art that the system 700 depicted in FIG. 7 represents a generalized schematic illustration and that other members/particles can be added or existing members/particles can be removed or modified.

The development system 700 can include a magnetic roll 730, a donor roll 740 and an image receiving member 750. The donor roll 740 can be disposed between the magnetic roll 730 and the image receiving member 750 for developing electrostatic latent image. The image receiving member 750 can be positioned having a gap with the donor roll 740. Although one donor roll 740 is shown in FIG. 7, one of ordinary skill in the art will understand that multiple donor rolls 740 can be used for each magnetic roll 730.

The magnetic roll 730 can be disposed interiorly of the chamber of developer housing to convey the developer material to the donor roller 740, which can be at least partially mounted in the chamber of developer housing. The chamber in developer housing can store a supply of developer material. The developer material can be, for example, a two-component developer material of at least carrier granules having toner particles adhering triboelectrically thereto.

The magnetic roller 730 can include a non-magnetic tubular member (not shown) made from, e.g., aluminum, and having the exterior circumferential surface thereof roughened. The magnetic roller 730 can further include an elongated magnet (not shown) positioned interiorly of and spaced from the tubular member. The magnet can be mounted stationarily. The tubular member can rotate in the direction of arrow 705 to advance the developer material 760 adhering thereto into a loading zone 744 of the donor roll 740. The magnetic roller 730 can be electrically biased relative to the donor roller 740 so that the toner particles 760 can be attracted from the carrier granules of the magnetic roller 730 to the donor roller 740 in the loading zone 744. The magnetic roller 730 can advance a constant quantity of toner particles having a substantially constant charge onto the donor roll 740. This can ensure donor roller 740 to provide a constant amount of toner having a substantially constant charge in the subsequent development zone 748 of the donor roll 740.

The donor roller 740 can be the roll member as similarly described in FIGS. 1-6 having a piezoelectric tape mounted on the a roll substrate 741. The donor roll 740 can include a plurality of electrical connections (not shown) embedded therein or integral therewith, and insulated from the roll substrate 741 of the donor roll 740. The electrical connections can be electrically biased in the development zone 748 of the donor roll 740 to vibrate and detach the developed toner particles from the donor roll 740 to the image receiving member 750. The image receiving member 750 can include a photoconductive surface 752 deposited on an electrically grounded substrate 754.

The vibration of the development zone 748 can be spatially controlled by individually or in-groups addressing one or more piezoelectric elements 745 of the donor roll 740 using the biased electrical connections, e.g., by means of a brush, to energize only those one or more piezoelectric elements 745 in the development zone 748. For example, the donor roll 740 can rotate in the direction of arrow 708, successive piezoelectric elements 745 can advance into the development zone 748 and can be electrically biased. Toner loaded on the surface of donor roll 740 can jump off the surface of the donor roll 740 and form a powder cloud in the gap between the donor roll 740 and the photoconductive surface 752 of the image receiving member 750, where development is needed. Some of the toner particles in the toner powder cloud can be attracted to the conductive surface 752 of the image receiving member 750 thereby developing the electrostatic latent image (toned image).

The image receiving member 750 can move in the direction of arrow 709 to advance successive portions of photoconductive surface 752 sequentially through the various processing stations disposed about the path of movement thereof. In an exemplary embodiment, the image receiving member 750 can be any image receptor, such as that shown in FIG. 7 in a form of belt photoreceptor. In various embodiments, the image receiving member 750 can also be a photoreceptor drum as known in the art to have toned images formed thereon. The toner images can then be transferred from the photoconductive drum to an intermediate transfer member and finally transferred to a printing substrate, such as, a copy sheet.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A roll member comprising:
   a roll substrate; and
   a piezoelectric tape mounted on a surface of the roll substrate to provide a localized surface vibration to cause toner particles that are adhered to the surface of the roll to be detached from the surface, wherein the piezoelectric tape comprises a plurality of controllable piezoelectric elements, and wherein each controllable piezoelectric element is individually addressable.

2. The member of claim 1, wherein the plurality of controllable piezoelectric elements are addressable in groups with each group comprising one or more controllable piezoelectric elements selected from the plurality of controllable piezoelectric elements.

3. The member of claim 1, wherein the roll substrate has a shape selected from the group consisting of a cylinder, a core, a belt, and a film.

4. The member of claim 1, wherein the plurality of controllable piezoelectric elements comprises a plurality of geometric shapes for use in a single piezoelectric tape.

5. The member of claim 1, wherein the plurality of controllable piezoelectric elements has a thickness of about 10 µm or higher.

6. The member of claim 1, wherein the plurality of controllable piezoelectric elements comprises a plurality of element thicknesses for use in a single piezoelectric tape.

7. The member of claim 1, wherein the plurality of controllable piezoelectric elements is produced from a piezoelectric ceramic material, an antiferroelectric material, an electrostrictive material, a magnetostrictive material or other functional ceramic material.

8. The member of claim 1, wherein the piezoelectric tape further comprises a first tape substrate and a second tape substrate having the plurality of controllable piezoelectric elements configured therebetween.

9. The member of claim 8, wherein each of the first tape substrate and the second tape substrate is conductive and flexible at least in one direction.

10. The member of claim 8, wherein at least one of the first tape substrate and the second tape substrate is a polymer tape comprising a patterned metallization layer that corresponds to the shapes and distribution of the plurality of controllable piezoelectric elements.

11. The member of claim 1, wherein the roll member is a donor roll member used in a development system in an electrophotographic printing machine.

12. A system for developing an image comprising:
    an imaging receiving member; and
    a donor roll comprising:
        a roll substrate; and
        a piezoelectric tape mounted on a surface of the roll substrate to provide a localized surface vibration to cause toner particles that are adhered to the surface of the roll to be detached from the surface, wherein the piezoelectric tape comprises a plurality of controllable piezoelectric elements, and wherein each controllable piezoelectric element is individually addressable,
    wherein the donor roll is arranged to be closely spaced from the imaging receiving member for advancing toner particle developer materials to an image on the imaging receiving member, wherein the plurality of controllable piezoelectric elements are arranged to form a toner cloud in the space between the donor roll and the image receiving member with detached toner particles from the toner cloud developing the image.

13. The system of claim 12, wherein each piezoelectric element has a resolution of about 100 dpi or higher.

14. The system of claim 12, wherein each piezoelectric element has a lateral dimension ranging from about 30 µm to about 500 µm and a thickness ranging from about 10 µm to about 1 mm.

15. The system of claim 12, wherein each piezoelectric element has an area of about 100 µm×100 µm or less with a thickness ranging from about 30 µm to about 100 µm.

16. The system of claim 12, wherein each piezoelectric element has a lateral dimension of about 40 µm or less, and a resolution of about 600 dpi or higher.

17. The system of claim 12, further comprising,
    a housing defining a chamber for storing a supply of developer materials therein, and
    a transport roll mounted in the chamber of the housing and positioned adjacent to the donor roll, the transport roll being adapted to advance at least a portion of the developer materials to the donor roll.

18. A method of forming a roll member comprising:
    forming a piezoelectric tape comprising a plurality of controllable piezoelectric elements that are arranged to provide a localized surface vibration to cause toner particles that are adhered to a surface of the roll member to be detached and are sandwiched by and electrically bonded with a first tape substrate and a second tape substrate, wherein each of the plurality of controllable piezoelectric elements are individually addressable; and
    mounting one of the first tape substrate and the second tape substrate on a surface of a roll substrate.

19. The method of claim 18, wherein forming the piezoelectric tape comprises,
    forming the plurality of controllable piezoelectric elements over a substrate, wherein each of the plurality of controllable piezoelectric elements has an electrode formed thereon,
    bonding the plurality of controllable piezoelectric elements to the first tape substrate,
    removing the substrate and exposing the plurality of controllable piezoelectric elements,
    depositing the second electrode on each of the plurality of exposed controllable piezoelectric elements, and
    bonding each second electrode to the second tape substrate.

20. The method of claim 18, wherein forming the piezoelectric tape comprises,
    temporally bonding one or more bulk piezoelectric material on a carrier plate,
    dividing each bulk piezoelectric material into the plurality of controllable piezoelectric elements having one or more shapes and dimensions according to a desired printing resolution, bonding the plurality of controllable piezoelectric elements with the first tape substrate, and replacing the carrier plate with the second tape substrate.

21. The method of claim 20, wherein dividing each bulk piezoelectric material comprises a laser cutting or a saw cutting.

22. The method of claim 18, further comprising, forming the plurality of controllable piezoelectric elements that is electrically bonded with a first tape substrate, mounting the first tape substrate on the surface of the roll substrate and exposing a surface of the plurality of controllable piezoelectric elements, and bonding the second tape substrate onto the exposed surface of the plurality of controllable piezoelectric elements, wherein the second tape substrate comprises a sleeve.

23. A method for developing an image using a donor roll comprising:

advancing developer materials that comprise toner particles to a donor roll, wherein the donor roll comprises a plurality of controllable piezoelectric elements;

controllably addressing one or more piezoelectric elements selected from the plurality of controllable piezoelectric elements to locally detach toner particles from the donor roll to form a toner cloud in a space between the donor roll and an image receiving member; and developing an image with detached toner particles from the toner cloud on the image receiving member.

* * * * *